United States Patent [19]

Voss

[11] Patent Number: 4,812,892
[45] Date of Patent: Mar. 14, 1989

[54] LIGHT CONTROLLABLE THYRISTORS

[75] Inventor: Peter Voss, Munich, Fed. Rep. of Germany

[73] Assignee: Siemens Aktiengesellschaft, Berlin and Munich, Fed. Rep. of Germany

[21] Appl. No.: 891,558

[22] Filed: Mar. 30, 1978

[51] Int. Cl.[4] .................................................. H01L 29/74
[52] U.S. Cl. ......................................... 357/38; 357/30; 357/55; 357/86
[58] Field of Search ......................... 357/38, 30, 55, 86

[56] References Cited

U.S. PATENT DOCUMENTS

| | | | |
|---|---|---|---|
| 3,978,513 | 8/1976 | Terasawa | 357/38 |
| 4,001,865 | 1/1977 | Voss | 357/38 |
| 4,012,761 | 3/1977 | Ferro et al. | 357/38 |
| 4,087,834 | 5/1978 | Temple | 357/38 |
| 4,092,703 | 5/1978 | Sueoka et al. | 357/38 |
| 4,114,178 | 9/1978 | Terasawa et al. | 357/51 |
| 4,122,480 | 10/1978 | Silber et al. | 357/38 |
| 4,739,387 | 4/1988 | Temple et al. | 357/38 |

FOREIGN PATENT DOCUMENTS 1185734 3/1970 United Kingdom ............. 357/38 A

Primary Examiner—Joseph E. Clawson, Jr.
Attorney, Agent, or Firm—Hill, Van Santen, Steadman & Simpson

[57] ABSTRACT

Light controllable thyristors in which the sensitivity to light of the thyristors has been increased by increasing the emitter shunt resistance for the auxiliary thyristor coupling to small area optical light guides. The shunt resistance is increased by providing one or more grooves in the base region between the light sensitive thyristor and the main power thyristor which provides that the control current must pass through a circuitous path toward lower regions of the base layer and, thus, increase the shunt resistance.

4 Claims, 3 Drawing Sheets

LIGHT CONTROLLABLE THYRISTORS

BACKGROUND OF THE INVENTION

1. Field of the Invention

This invention relates in general to light controllable thyristors and in particular to a novel thyristor structure.

2. Description of the Prior Art

Light sensitive thyristors of the prior art have included main power thyristors and auxiliary thyristors in which the high shunt resistance of the auxiliary thyristor was achieved by a low doping of the p-base, or by n-doped ballast regions.

SUMMARY OF THE INVENTION

The present invention provides a light controllable thyristor which is formed of a semiconductor element in which the cathode area has at least one section which is used for exposure to light energy and which has a main emitter area adjacent the cathode and a cooperating auxiliary emitter section between the main emitter and exposure area and wherein a base area on the cathode portion is doped to provide a decreasing concentration toward the anode and further includes emitter electrodes which contact the base area.

A thyristor of this type has been described previously which consists of two parts where one part forms the light controlled auxiliary thyristor and the other portion forms the main thyristor. The light sensitive auxiliary thyristor is used as an amplifier for the gate current of the main thyristor which after initiation of firing carries the load current. Between the light controlled auxiliary thyristor and the main thyristor a further auxiliary thyristor can be mounted. The photo current of the light controlled auxiliary thyristor flows during exposure of the area which is exposed to light exposure into an electrode which contacts the collector area and from there in a radial direction to the emitter of the auxiliary thyristor or the main thyristor respectively. As soon as the emitter base voltage exceeds in one area of the pn junction between the base area and the emitter of the auxiliary thyristor and one particular value of voltage might be approximately 0.5 V, the particular thyristor will fire. In practice, it is desirable to control the light sensitive auxiliary thyristor by means of a fiber optics system. These fiber optics normally have diameters of 1 millimeter or less. So as to achieve good du/dt stability which depends among other factors on the resistivity of the base layer it is desirable to make the diameter of the area set aside for the exposure only so much larger than the diameter of the fiber optic strand than is required for making contact. On the other hand, however, so as to work with the minimum light input, the sensitivity of the light controlled auxiliary thyristor must be relatively high. It is possible to increase the light sensitivity for example by using very low doping levels in the base layer which results in a high resistivity and causes even at various small current levels a voltage drop which is sufficient to fire the thyristor.

The object of the present invention is to provide a thyristor of the above mentioned type wherein even at high doping levels in the base layer high light sensitivity will be assured.

The invention is specifically directed to the fact that the auxiliary emitter zone is separated from the part of the base zone which contacts the auxiliary emitter electrode in a portion of its periphery by at least one groove which is formed in the base zone which is at least as deep as the second emitter zone and wherein the particular portion of the auxiliary emitter zone which carries the part of the auxiliary emitter electrode in contact with the base layer forms one or several connections which are at least on two sides terminated by a groove or by grooves.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
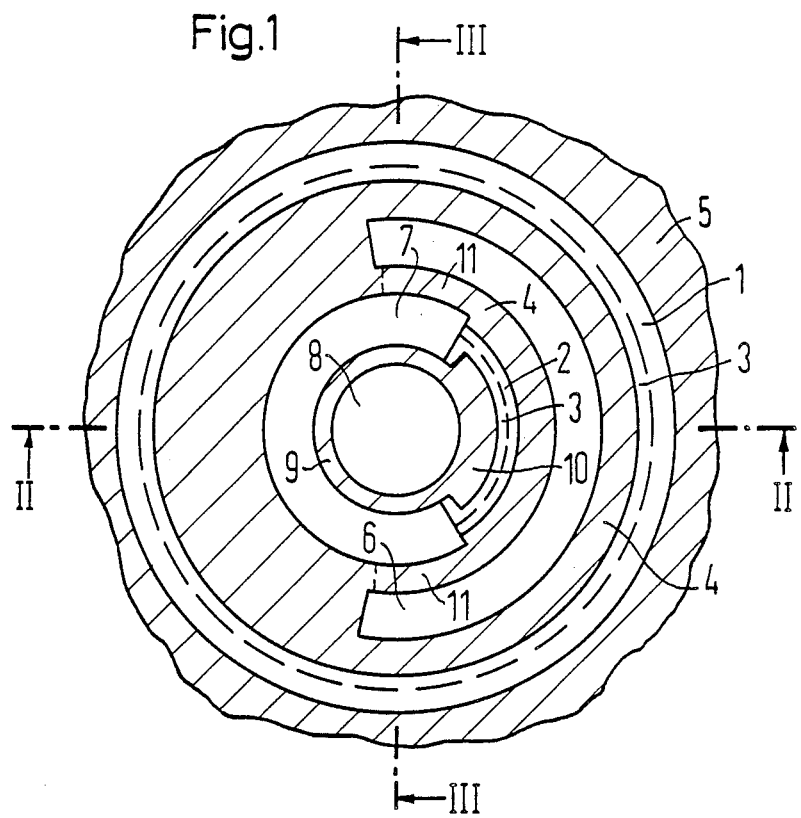
FIG. 1 is a top plan view of a semiconductor element illustrating a thyristor according to the invention.
Figure 2:
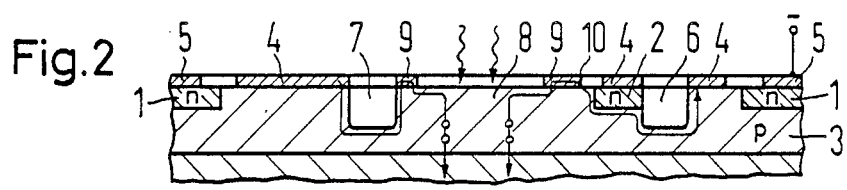
FIG. 2 is a sectional view taken from FIG. 1 on line II—II.
Figure 3:
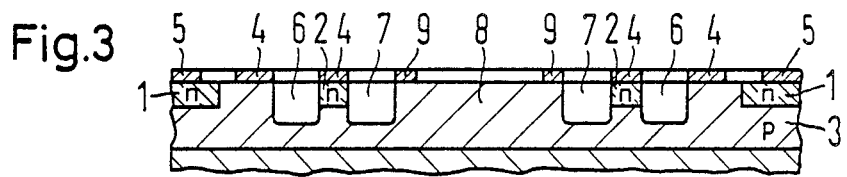
FIG. 3 is a sectional view of the invention taken on lines III—III from FIG. 1.

The semiconductor element illustrated in FIGS. 1, 2 and 3 comprises a base area 3 which might be of p type semiconductor material in which is formed an annular n type main emitter region 1. A semicircular auxiliary emitter area 2 is formed of n type material within the main emitter 1. The base layer 3 is common to both emitter zones 1 and 2 and is doped so that the doping concentration decreases as a function of distance from the surface upon which the main emitter electrode 5 and auxiliary emitter electrode 4 are mounted. The auxiliary emitter area 2 is part of the light controlled auxiliary thyristor and the main emitter area 1 is part of the main thyristor.

The main emitter area 1 is contacted by an emitter electrode 5 and the auxiliary emitter area 2 is in electrical contact with the auxiliary emitter electrode 4 as shown. The light exposure area is indicated by 8 and it is surrounded by a circular ring collector electrode 9 which is formed with a portion 10 which is wider in radial dimension as shown in FIG. 1 than the remaining portions of the ring collector electrode 9. The auxiliary emitter area 2 is in the form of a circular segment. That portion of the auxiliary emitter electrode 4 which contacts the auxiliary emitter area 2 is separated from the portion of the auxiliary emitter electrode 4 which contacts the base layer 3 by a circular segmented groove 6 formed in a part of the periphery of the auxiliary emitter area 2. Between the area intended for light exposure 8 of the base layer 3 and the emitter electrode 4 another circular segmented groove 7 is provided which overlaps at its ends with the ends of the groove 6 and the ends of the emitter area 2 so as to form bridges 11 as shown in FIG. 1. The portion of the auxiliary emitter area 2 which carries the portion of the auxiliary emitter electrode 4 which contacts the base layer 3 forms the bridges 11 which are terminated on both sides by the grooves 6 and 7.

When the area 8 is exposed to light, electron hole pairs are generated in the base 3 and under the influence of the polarity of the emitter electrode 5, the holes will move first in the direction of area 8 toward the cathode side and the electrons will move toward the anode side. The route taken by the carriers is indicated schematically by arrows in FIG. 2. It is to be observed that the current is forced by the grooves 6 and 7 to make a circuitous path which leads into the inner portions of base layer 3 having lower dopant concentration. The grooves 6 and 7 are therefore at least as deep as the emitter zone 2. The grooves 6 and 7 can be formed using selective etching techniques, for example, in conjunction with the known photoresist techniques.

The photo current flows so as to avoid the grooves 6 and 7 toward the portions of the emitter electrode which faces away from the area 8 and generates a voltage drop under the emitter area 2. The photo current of the light controlled auxiliary thyristor flows radially toward the outside after passing the extension 10 of collector electrode 9 which is positioned in the opening of the groove 7 having circular segment shape. By this arrangement a concentration of photo current is achieved for the auxiliary thyristor as soon as it exceeds the required value for firing the auxiliary thyristor. The auxiliary thyristor is turned on with relatively little delay in firing due to the high current density caused by the concentration effect. The collector electrode 9 is not directly required for the function of the auxiliary thyristor. It is, however practical to provide at least for one electrode corresponding to the extension 10 for the purpose of providing that the photo current can flow uniformaly to the auxiliary emitter area 2.

Figure 4:
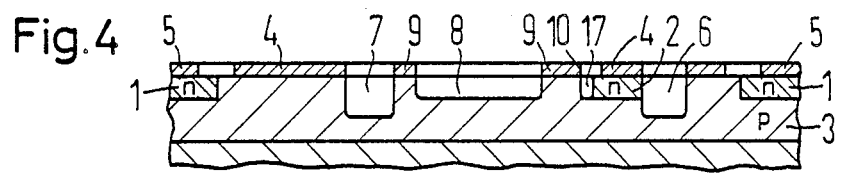
FIG. 4 is a sectional view of a modification of the invention.

FIG. 4 illustrates a modification of the embodiment illustrated in FIGS. 1 through 3 wherein the area 8 which is to be exposed is thinner than the balance of the base layer 3. So as to further increase the sensitivity for firing the auxiliary thyristor an additional groove 17 is formed between the collector electrode 9 and the emitter area 2.

Figure 5:
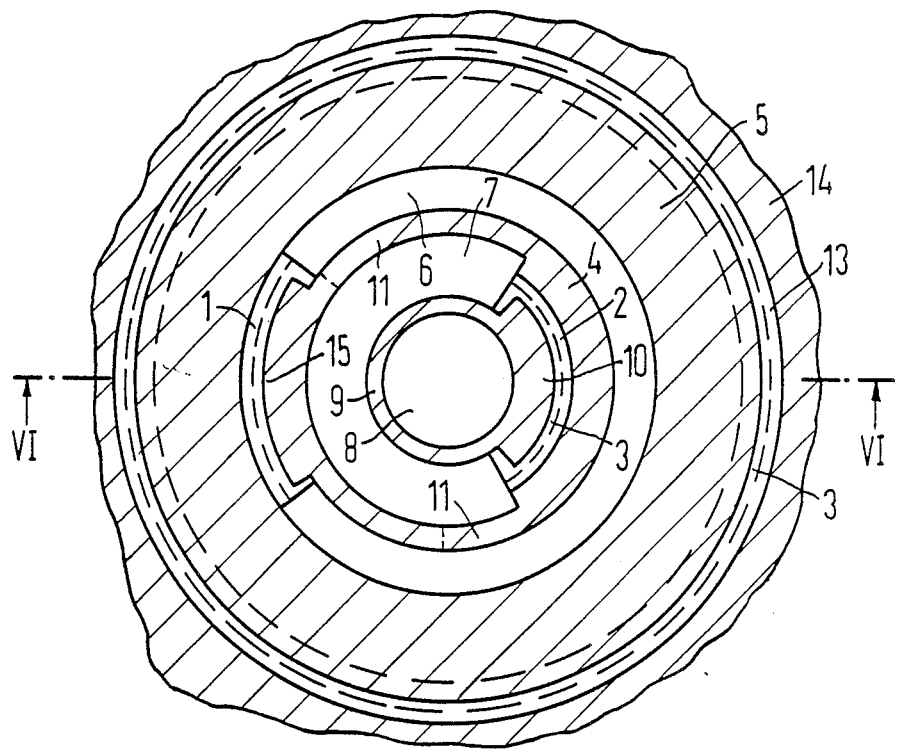
FIG. 5 is a top plan view of a modification of the invention.
Figure 6:
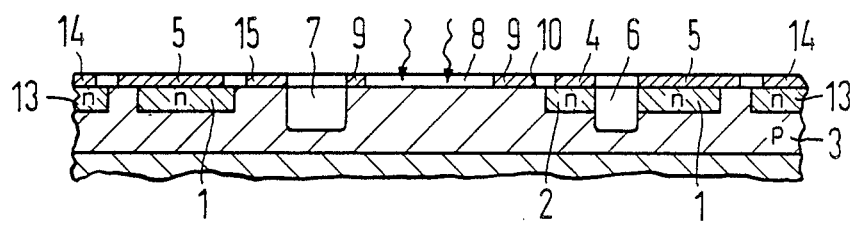
FIG. 6 is a cross-sectional view taken on line VI—VI from FIG. 5.

FIGS. 5 and 6 illustrate a further embodiment wherein the main emitter area 1 is used as an additional auxiliary emitter area and a third emitter area 13 is introduced which is located outside the emitter area 1 which faces away from the area 8 and this serves as part of the main thyristor. The emitter area 13 is provided with an electrode 14. The auxiliary emitter electrode 4 has a circular segmented extension 15 which is situated between the ends of the groove 6. Due to this circular segmented extension 15, a concentration of the control current for the second auxiliary thyristor emitter 1 will result which causes it to fire as desired with very little delay in firing.

The length of the extensions 10 and 15 which are segment shaped can be varied. The active periphery of the emitter area 1 and 2 determine and adjust the pn junction facing the area 8 and determine the turn on characteristics of the light controlled auxiliary thyristor and of the second auxiliary thyristor. If the ratio of the active junction length of the emitter area 1 to that of the emitter area 2 facing the area 8 is made smaller than the ratio of 3:1 as illustrated in FIG. 5 wherein the ratio is approximately 1:1 the result is that the smaller ratio 1:1 provides that the light controlled auxiliary thyristor functions only in the form of a current amplifier which means that it will not fire. This results in the advantage that no load current channel is formed in the light controlled thyristor during turn on.

Figure 7:
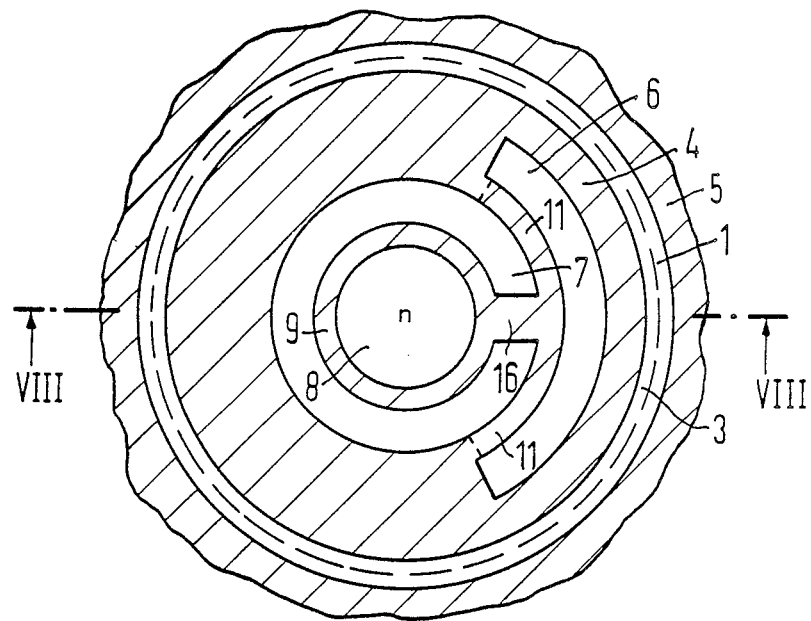
FIG. 7 is a top plan view of a further modification of the invention.
Figure 8:
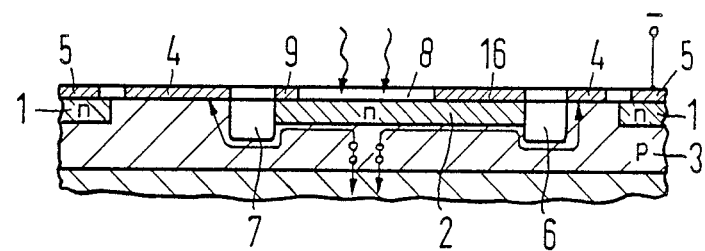
FIG. 8 is a cross-sectional view taken on line VIII—VIII from FIG. 7.

FIGS. 7 and 8 illustrate an embodiment wherein the auxiliary emitter zone 2 can also cover the area 8 which is intended for light exposure. In this modification, the groove 7 narrows the auxiliary emitter area 2 to the bridge 16 which is in turn connected to the two bridges 11. The generated holes in this case take a path as indicated by the arrow vertical to the auxiliary emitter area 2 and flow beneath it into the emitter electrode 4 by avoiding the grooves 6 and 7 and flow from there to the emitter area 1 which can be either part of an auxiliary thyristor or of the main thyristor. In these illustrative examples the grooves are indicated as circular segments of a circle. This form is recommended if the area 8 is intended for light exposure and is centrally located. The grooves, however, can also take different shapes and run, for example, in a radial direction. Also, a combination of circular segment shape grooves with radial grooves can be used. The grooves can also be connected to each other in such a fashion that one or several small bridges are formed in the auxiliary emitter region 2. The grooves can be covered with an insulated or other high resistive material.

It is to be realized that the embodiments illustrated in FIGS. 4 through 8 utilize the common numeral designations for the portions illustrated in FIGS. 1 through 3 and the description of such structures is not repeated.

Although the invention has been described with respect to preferred embodiments it is not to be so limited as changes and modifications may be made which are within the full intended scope as defined by the appended claims.

I claim as my invention:

1. A light controlled thyristor comprising a semiconductor element which has a cathode area which receives light energy formed on one surface, a main emitter region and an auxiliary emitter region formed in said one surface and said auxiliary emitter region located between said cathode area and said main emitter region, said semiconductor element has a base layer region of thickness on said first surface which has a dopant concentration which decreases as a function of distance from said one surface, an auxiliary emitter electrode which contacts said base layer and said auxiliary emitter region (2) and separated by a groove (6) which separates the part of the auxiliary emitter electrode (4) which contacts said base layer in part of its circumference from said part which contacts said auxiliary emitter, said groove extending into said base layer region and being at least as deep as said auxiliary emitter region, and a particular section of auxiliary emitter area (2) which carries the auxiliary emitter electrode (4) which contacts the base region (3) forms one or more bridges (11) which are at least on two sides terminated by said groove (6), and wherein said auxiliary emitter region (2) and said groove (6) are designed in the form of a ring segment and that between the area (8) which is for light exposure and said base region (3) a second groove (7) is arranged in the form of a ring segment in such a fashion that the ends of the second groove (7) overlap with the groove (6) and the auxiliary emitter region (2) and wherein bridges (11, 11) are formed on both ends of said auxiliary emitter area.

2. A thyristor according to claim 1 wherein said cathode region (8) is surrounded by a circular collector electrode (9) which contacts the base region (3).

3. A thyristor according to claim 2 wherein the collector electrode (9) has an extension in form of a circular segment (10), which is situated between the ends of the second groove (7).

4. A thyristor according to claim 1 wherein said auxiliary emitter electrode (4) is of circular form and has a circular segmented protrusion (15) which is situated between the ends of said groove (6).

* * * * *